United States Patent
Harvey et al.

(10) Patent No.: US 8,311,609 B2
(45) Date of Patent: Nov. 13, 2012

(54) MRI THERMOMETRY INVOLVING PHASE MAPPING AND REFERENCE MEDIUM USED AS PHASE REFERENCE

(75) Inventors: Paul Royston Harvey, Eindhoven (NL); Andriy Shmatukha, Utrecht (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 1129 days.

(21) Appl. No.: 11/572,712

(22) PCT Filed: Jul. 29, 2005

(86) PCT No.: PCT/IB2005/052561
§ 371 (c)(1),
(2), (4) Date: Jan. 26, 2007

(87) PCT Pub. No.: WO2006/013547
PCT Pub. Date: Feb. 9, 2006

(65) Prior Publication Data
US 2008/0287773 A1    Nov. 20, 2008

(30) Foreign Application Priority Data
Aug. 2, 2004 (EP) .................................... 04103717

(51) Int. Cl.
*A61B 5/05* (2006.01)

(52) U.S. Cl. ........................................ 600/412; 600/410

(58) Field of Classification Search .................. 600/410, 600/412
See application file for complete search history.

(56) References Cited

U.S. PATENT DOCUMENTS

| 5,916,161 A * | 6/1999 | Ishihara et al. ............... 600/410 |
| 6,556,856 B1 * | 4/2003 | Mistretta et al. ............... 600/420 |
| 6,618,608 B1 * | 9/2003 | Watkins et al. ............... 600/412 |
| 2005/0065429 A1 * | 3/2005 | Zhou ............................ 600/412 |

OTHER PUBLICATIONS

Rieke et al, "Referenceless PRF Shift Thermometry", Magnetic Resonance in Medicine vol. 51, p. 1223-1231 Published May 24, 2004.*

* cited by examiner

*Primary Examiner* — Brian Casler
*Assistant Examiner* — Joseph M Santos

(57) ABSTRACT

A computing unit is arranged to access phase images computed from the image data and representative of the target medium and the reference medium and carry out computing steps to yield temperature difference map. The operation of the computing is controlled by a computer program carrying computing steps programmed as instructions to a processor. The apparatus (1) includes a storage unit (8) arranged to store suitable image data which are accessed by the computer program during the computations. The storage unit (8) stores system parameters of the magnetic resonance apparatus, like the strength of the main field (B0), gyromagnetic ratio ($\gamma$), and suitable parameters of a target medium, like screen constant ($\alpha$), in a file (3). The apparatus (1) further includes a working memory (6), typically based on RAM. An output (9) of the apparatus includes the computed temperature difference map, which can be used to control a suitable medical diagnostic or therapeutic device, or it may be visualized to a user or be stored for archiving purposes. For feed-back purposes, the apparatus includes a display (7) to visualize the computed temperature difference map. Preferably, the temperature difference map is visualized within a suitable interactive graphic user interface (7a).

20 Claims, 5 Drawing Sheets

Figure 1:
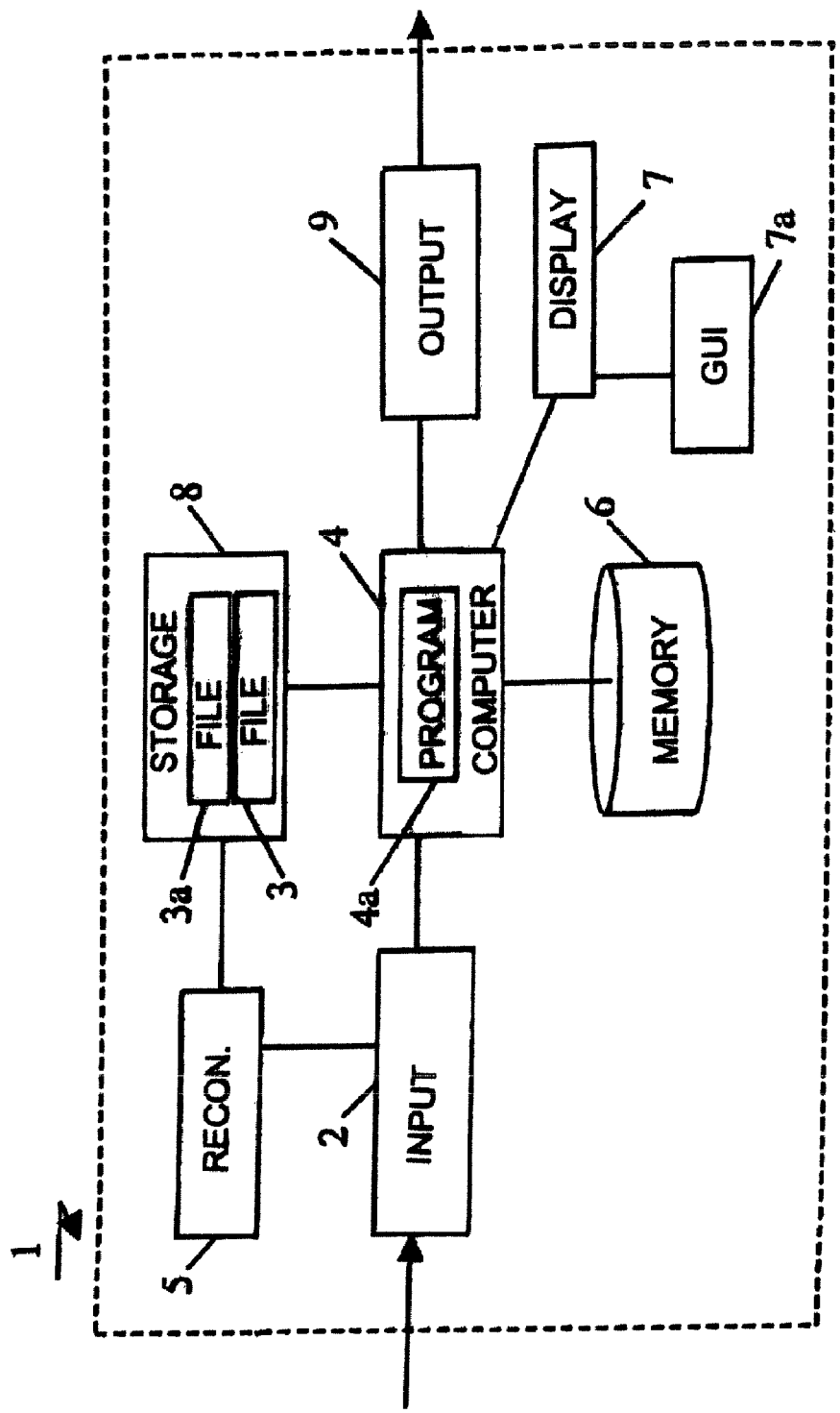

MRI THERMOMETRY INVOLVING PHASE MAPPING AND REFERENCE MEDIUM USED AS PHASE REFERENCE

The invention relates to an apparatus arranged to compute a temperature difference map from image data indicative of magnetic resonance signals emitted from an object subjected to a magnetic resonance imaging during a procedure of a temporal local temperature variation within the object between a first time moment and a second time moment, said object comprising a target medium and a reference medium.

The invention further relates to an imaging system.

The invention still further relates to a method for computing a temperature difference map using image data indicative of magnetic resonance signals emitted from an object subjected to a magnetic resonance imaging during a procedure of a temporal local temperature variation within the object between a first time moment and a second time moment, the object comprising a target medium and a reference medium.

The invention still further relates to a computer program.

An embodiment of an apparatus as is set forth in the opening paragraph is known from U.S. Pat. No. 6,615,069. The known apparatus is arranged to correct spatial phase errors in absolute temperature maps obtained from single measurements. The phase corrected images are subsequently subtracted from each other to yield a temperature difference map. In order to provide independent absolute temperature maps the known apparatus is arranged to carry out a complicated step of a suitable phase unwrapping by finding spatial phase distributions and temperature distributions from image data sets acquired for the first time moment and for the second time moment. In particular, one pixel in the object data is defined as a base point and phases of adjacent points are compared successively from the base point to detect a point whose phase difference becomes greater than a predetermined threshold. The area beyond this point is regarded as arctangent aliasing and $2\pi$ is added to or subtracted from the phase of pixels in that area.

It is a disadvantage of the known apparatus that only constant phase errors, present at the first time moment and the second time are eliminated. The time dependent phase errors, occurring in a data acquisition system of a magnetic resonance apparatus between the first time moment and the second time moment, are not corrected for.

It is an object of the invention to provide an apparatus, whereby constant phase errors and time dependent phase errors are eliminated prior to establishing a temperature difference map.

To this end the apparatus according to the invention comprises:
a computing unit arranged to:
i. access a first phase image computed from the image data and representative of the target medium for the first time moment;
ii. access a second phase image computed from the image data and representative of the reference medium for the first time moment;
iii. access a third phase image computed from the image data and representative of the target medium for the second time moment;
iv. access a fourth phase image computed from the image data and representative of the reference medium for the second time moment;
v. compute a first phase map by subtracting the first phase image from the third phase image for the target medium;
vi. compute a second phase map by subtracting the second phase image from the fourth phase image for the reference medium;
vii. compute the temperature difference map from the first phase map subtracted with the second phase map.

The technical measure of the invention is based on the insight that the ability to acquire thermal images of the inside of the object, notably a human body, has potential applications in many medical interventions, like specific absorption rate (SAR) management, radio-frequency ablation control, radio-frequency hypothermia, etc., whereby the dynamic range of temperature change, in particular for SAR management is required to be accurate to about 0.2 degrees. Thermal imaging to this level of accuracy may be achieved using proton frequency shift (PFS) technique. Up to now the possibility to obtain the required level of temperature sensitivity for in-vivo applications has been hindered by the fact that the PFS method is a phase sensitive method which is influenced, for example by a B0 drift, a change in a shimming within the patient during the procedure. These phenomena may lead to gross errors in the calculation of temperature difference maps.

The object of the invention is reached by using a signal from the reference medium within the object, which does not exhibit a temperature dependent frequency shift, as a reference means for tracking system instability independent of a temperature change. For humans it is found that fat is particularly suitable to be used as the reference medium, the target medium being soft tissue, for example. Fat is present almost everywhere in the body, which means that it can be imaged within the same region of interest defined for the target medium. Essentially, according to the invention the signal from fat is demarcated from the water signal and is used as a reference to correct for phase errors introduced by B0 drift and changes in shimming due to changes in bulk susceptibility as a result of breathing of the patient, for example.

For this purpose the computing unit is arranged to access the first phase image, the second phase image, the third phase image and the fourth phase image and to use them for eliminating the time dependent phase errors. These images may be reconstructed using a suitable image reconstructor based on the image data. It is noted that the arrangement of the computing unit to access remotely available respective phase images is contemplated as well. For this purpose internet and/or intranet resources may be used as well as means of wireless communication. This functionality allows controlling a suitable medical procedure from a substantially remote location.

Preferably, an image acquisition method is used, whereby simultaneously independent two-dimensional fat only and water only images of a patient's anatomy at the first time moment and the second time moment are acquired. The suitable sequence will be explained in further details with reference to FIG. 4. Alternatively, the fat image may be derived from a single image acquired using, for example a rapid imaging method whereby the TE is arranged so that fat and water signals are in phase. The regions of fat only may be demarcated using a suitable known per se tissue segmentation algorithm. The fat only image will be further used as the reference image.

The computing unit of the apparatus according to the invention is arranged to correct the image for the target medium with the signal from the reference medium, thus eliminating not only the constant phase errors, but also the time dependent phase errors occurring in the period between the first time moment and the second time moment. This feature is based on the insight that the image for the target medium contains phase evolution which is dependent upon all system imperfections and the temperature. The image for the reference medium contains phase evolution which is dependent upon all the same system imperfections except temperature. Thus, the apparatus according to the invention provides a more robust way of computing the temperature difference maps due to the fact that the phase information using temperature insensitive fat phase map has removed all spurious phase errors that arise from system imperfections. In order to calculate the absolute temperature difference map the first phase map subtracted with the second phase map is divided by a product of an echo time TE, gyromagnetic ratio $\gamma$, main field strength B0 and screen constant $\alpha$ for the target medium.

As an additional advantage, it has been surprisingly found that, by computing the second phase map and using it for the computation of the temperature difference map, the phase difference from the target medium, due to the phase shift of the reference medium as a result of the different Larmor frequency of the second medium, for example fat, is also eliminated. It is noted that always working with phase differences within the same chemical species effectively eliminates the DC frequency offset of that species. For example, if water is at 0 Hz and fat is at 440 Hz, a B0 drift of the magnet over time, which results in a frequency shift of about 50 Hz, will yield a new resonant frequency for water and fat of 50 Hz and 490 Hz, respectively. Subtracting the two phase images for, for example, water corresponding to different time moments, identifies the frequency shift of 50 Hz. Doing the same with the fat phase images yields also 50 Hz. Thus, when subtracting phase images from different chemical species, it is advantageous to use only phase difference images of each species.

In an embodiment of the apparatus according to the invention, the apparatus further comprises an input arranged to forward the image data to the computing unit, the computing unit being further arranged to compute the first phase image, the second phase image, the third phase image, the fourth phase image. The input of the apparatus according to the invention is preferably arranged to input the image data acquired using the magnetic resonance apparatus and to make it available to the computing unit. By arranging the computing unit to calculate the respective phase images, the overall architecture of the apparatus according to the invention is simplified.

In a further embodiment of the apparatus according to the invention the computing unit is further arranged to calculate respective binary masks for the first phase image and for the second phase image.

This technical measure is based on the insight that numerical errors during subsequent calculations may be removed when a binary mask image is defined based upon the signal intensity of the combined magnitude image for the target medium and the reference medium. The mask image is preferably scaled to 0 where no signal is detected and to 1 where signal exists. Subsequent calculations are performed only in regions where signal exists. This technical measure improves the accuracy and speed of the subsequent computations.

In a still further embodiment of the apparatus according to the invention the computing unit is further arranged to fit the second phase image with a smoothing function.

It is found to be preferable to fit a two-dimensional surface to the second phase image, preferably using a weighted polynomial fit. The resulting image has a continuous phase surface of the whole two-dimensional field of view.

It must be noted that in the context of the foregoing, the term image data represents spatial information and is complex in nature comprising a real part and an imaginary part.

The complex image data can be represented as a magnitude image and a phase image. All mathematics on this data can be performed either in the complex domain (using real and imaginary data) or in polar coordinates (using magnitude and phase). It is preferred to make calculations in the complex domain. Also, although the operation of the apparatus according to the invention is explained with reference to two-dimensional image data, a three-dimensional image data may be used in a similar fashion.

It is noted, that while the method is described in terms of mathematical operations on phase images, it is preferable to perform mathematical operations using equivalent complex mathematical operations, for example division of complex image data instead of subtracting the image phase. The step of computing the final phase is then made only at very last instance. This minimizes the possibility of errors due to arctangent aliasing.

The magnetic resonance imaging system according to the invention comprises the apparatus according to the invention, as is explained with reference to the foregoing, and a magnetic resonance apparatus arranged to acquire image data indicative of magnetic resonance signals emitted from an object subjected to a magnetic resonance imaging during a procedure of a temporal local temperature variation within the object between a first time moment and a second time moment.

The imaging system according to the invention provides means for a real-time computation of the temperature difference maps, which may advantageously be used for controlling certain medical procedures, like SAR management, RF-ablation control, RF-hyperthermia control, etc.

In an embodiment of the magnetic resonance imaging system according to the invention, the magnetic resonance apparatus is further arranged to acquire the image data using simultaneous imaging of the target medium and the reference medium.

Preferably, a rapid imaging method with a suitable TE is used so that signals from the reference medium and the target medium are in phase.

In a further embodiment of the magnetic resonance imaging system the magnetic resonance apparatus is further arranged to acquire the image data using an interleaved acquisitions of respective magnetic resonance images of the target medium and the reference medium.

This embodiment is particularly useful for imaging a patient, which may move. By providing an interleaved water/fat acquisition the imaging system ensures robust spatial registration of water and fat images even during patient motion. This is explained by the fact that during acquisition of an interleaved fat/water image an acquisition of a k-space line from water and then a k-space line for fat, and so on, is carried out. This is different to the case of acquiring first a whole water image and then a whole fat image. In the case of an interleaved fat and water image, the effective temporal delay between water and fat image is just the time of the TR, which is usually in the order of 10 ms. When a whole water image is acquired followed by a whole fat image, the temporal difference between images can be as large as tens of seconds, which is much more sensitive to patient motion.

A method according to the invention comprises the steps of:

accessing a first phase image computed from the image data and representative of the target medium for the first time moment;

accessing a second phase image computed from the image data and representative of the reference medium for the first time moment;

accessing a third phase image computed from the image data and representative of the target medium for the second time moment;

accessing a fourth phase image computed from the image data and representative of the reference medium for the second time moment;

computing a first phase map by subtracting the first phase image from the third phase image for the target medium;

computing a second phase map by subtracting the second phase image from the fourth phase image for the reference medium;

computing the temperature difference map from the first phase map subtracted with the second phase map.

As has been explained with reference to the apparatus according to the invention, by demarcating the reference medium which exhibits no temperature dependent frequency shift, a track of the system stability of the magnetic resonance imaging apparatus is enabled. By subtracting the second phase map from the first phase map both the constant and time dependent system instabilities are eliminated yielding an accurate temperature dependent map. A schematic work-flow of the method according to the invention is discussed with reference to FIG. 5. Further advantageous embodiments of the method according to the invention are set forth with reference to claims 10-13.

A computer program according to the invention is arranged to comprise instructions to cause a processor to carry out the steps of the method as is set forth in the foregoing.

These and other advantages of the invention are further discussed with reference to figures.

FIG. 1 presents a schematic view of the apparatus according to the invention.

Figure 2:
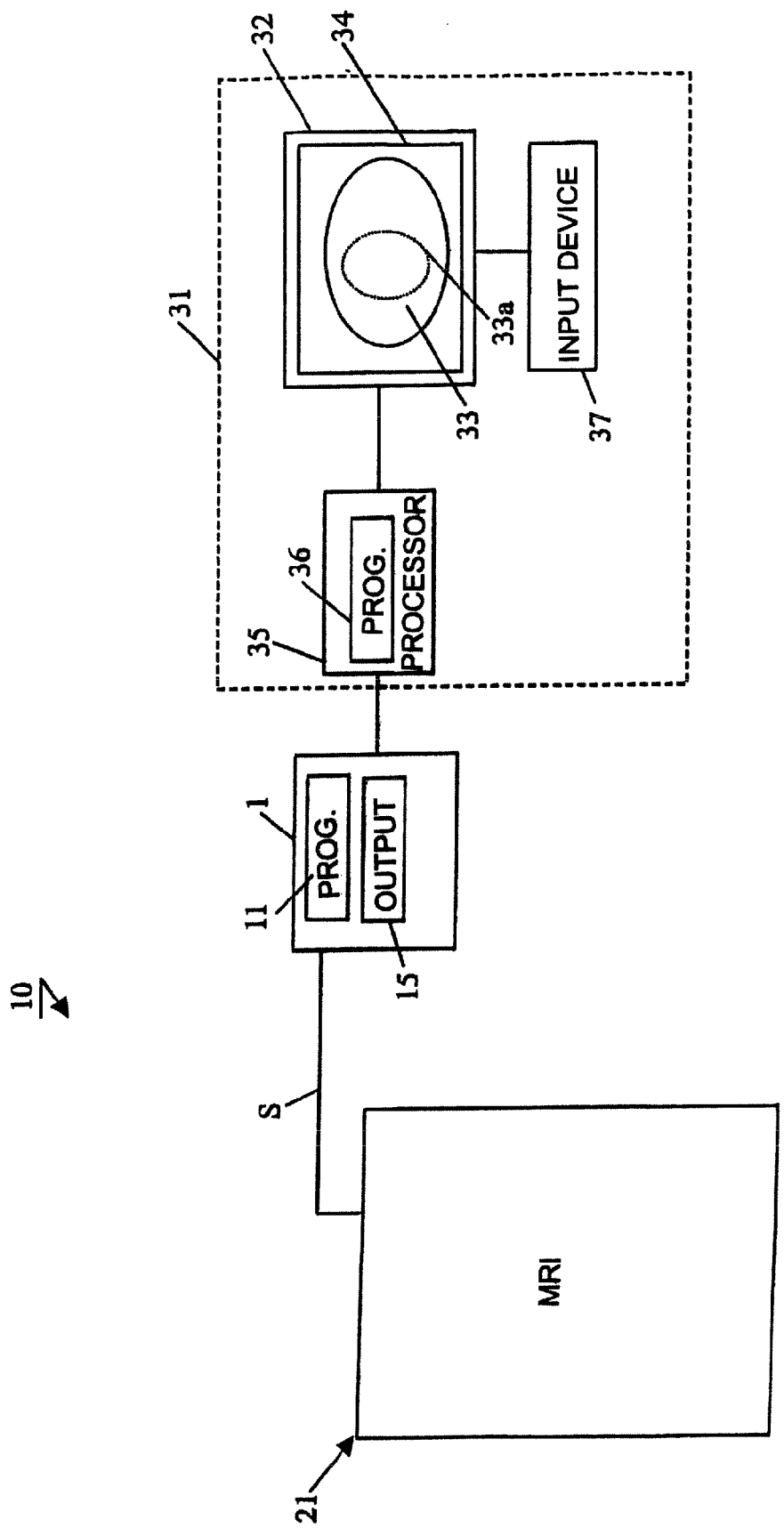

FIG. 2 presents a schematic view of an imaging system according to the invention.

Figure 3:
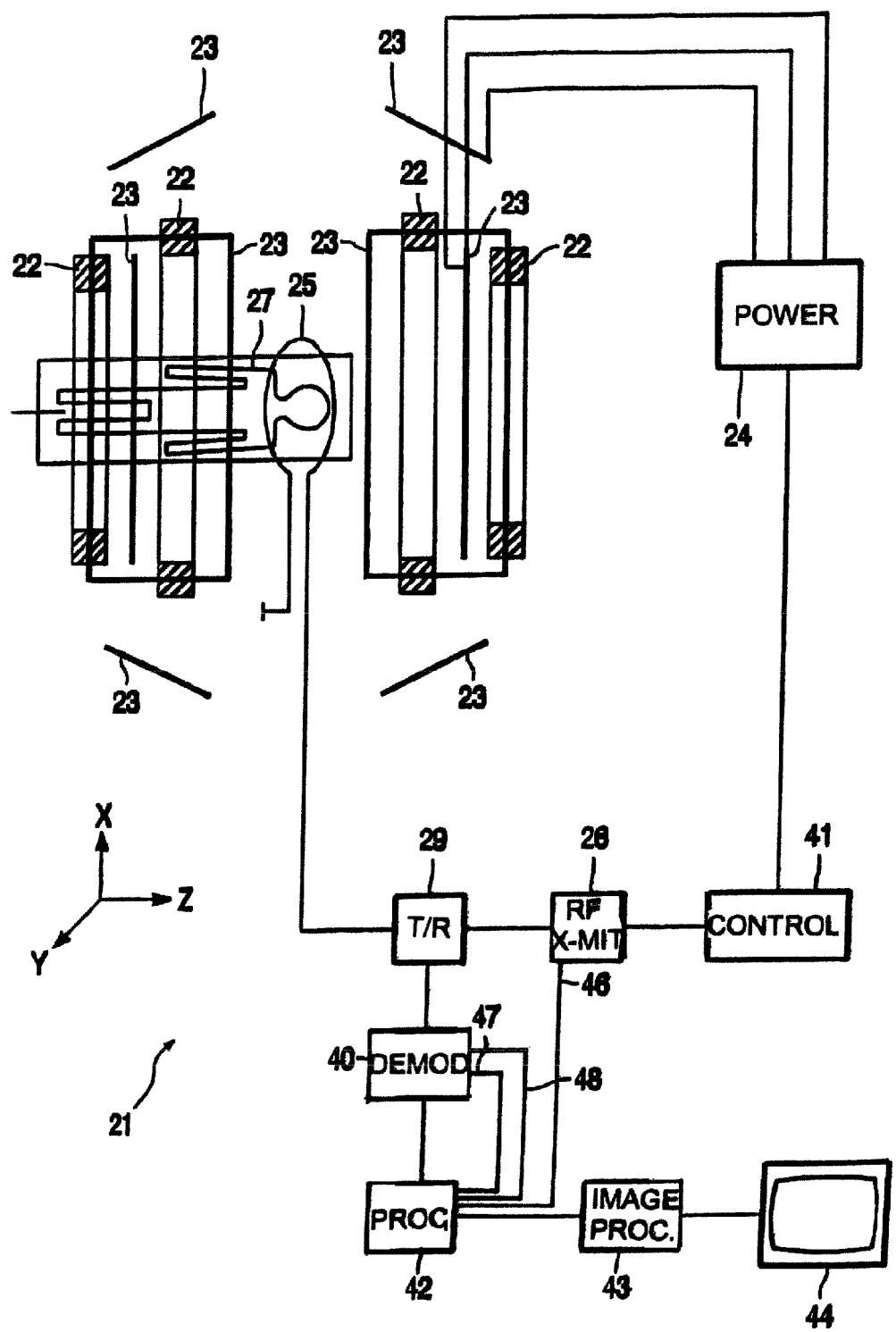

FIG. 3 presents in a schematic way an embodiment of a magnetic resonance apparatus.

Figure 4:
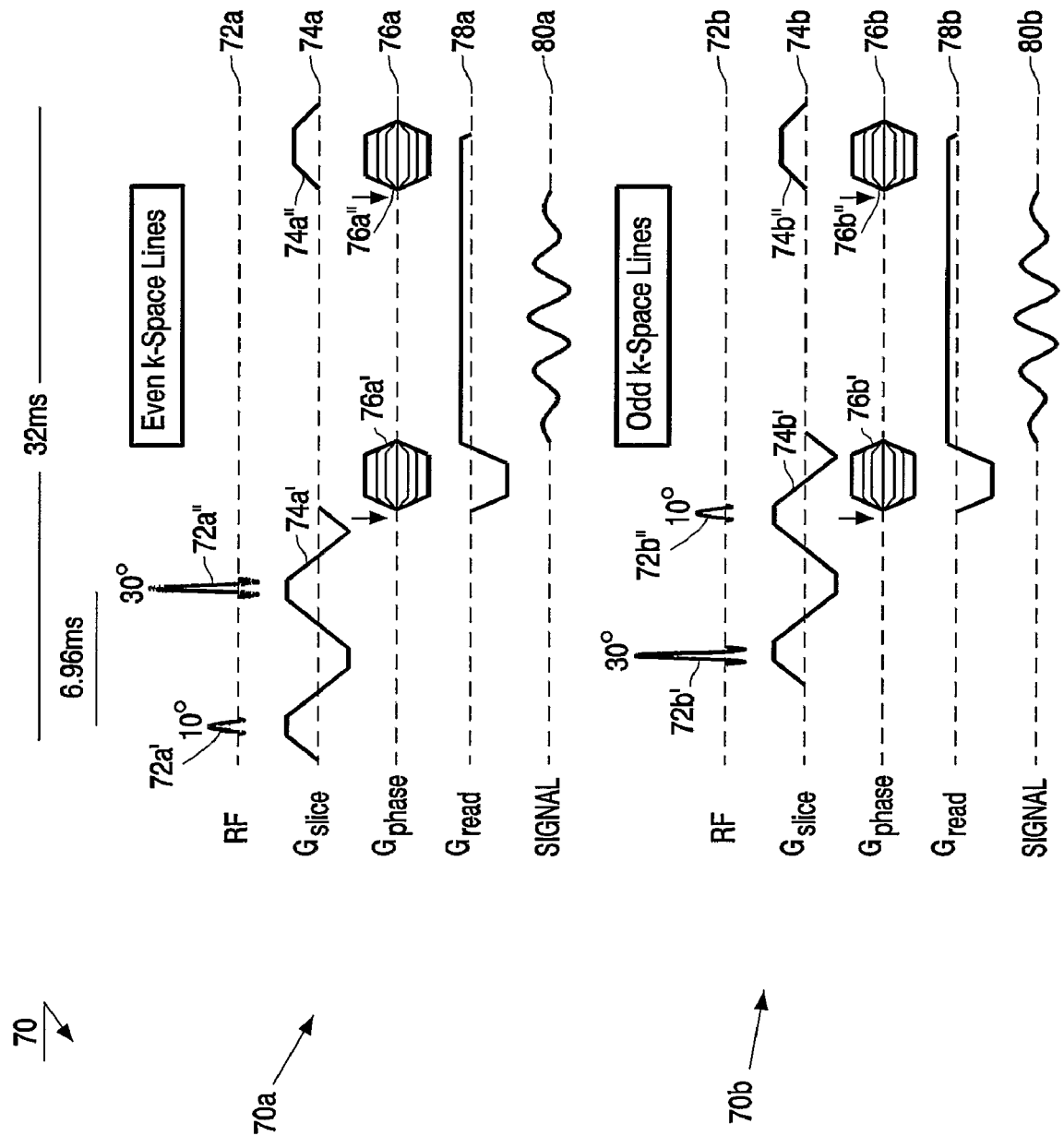

FIG. 4 presents a schematic view of a suitable data acquisition sequence.

Figure 5:
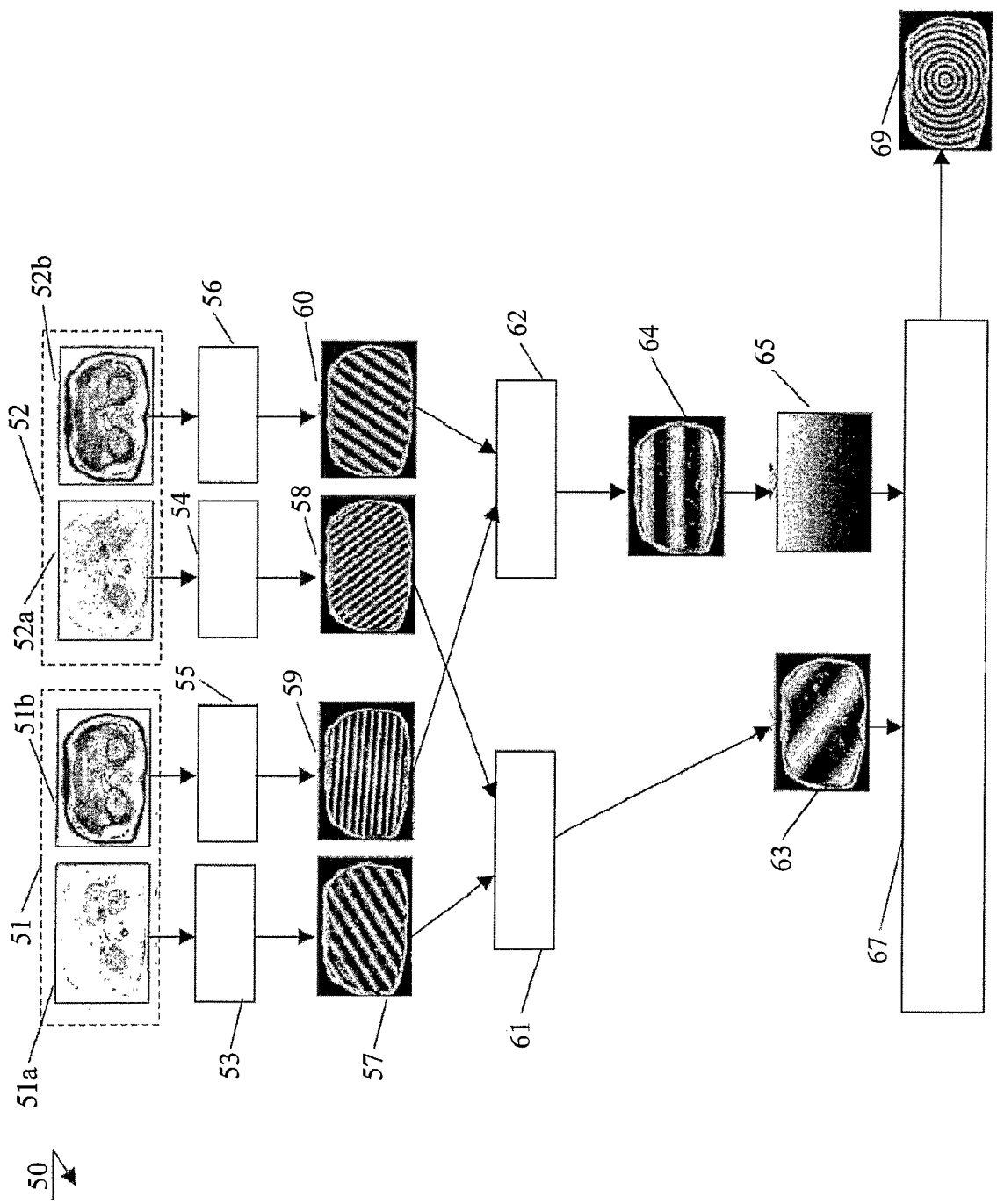

FIG. 5 presents a schematic view of a block-scheme of a work-flow of the method according to the invention.

FIG. 1 presents a schematic view of the apparatus according to the invention. The core of the apparatus 1 is formed by a computing unit 4 which is arranged to access respective phase images and carry out computing steps to yield temperature difference map according to the method of the invention. The respective phase images may, for example be computed by an image reconstructor 5 based on the image data provided by the input 2 and be stored in a file 3a of a storage unit 8. Alternatively, the respective phase images may be accessed from a remote source. Still alternatively, the respective phase images may be computed by the computing unit 4 from the image data provided by the input 2. The operation of the computing unit is preferably controlled by the computer program according to the invention, whereby the suitable computing steps are programmed as instructions to a suitable processor.

The input 2 is preferably arranged for receiving a suitable image data of an object, notably either two-dimensional images of the target medium and the reference medium, or a three-dimensional image of the target medium and the reference medium, in any suitable form. For example, the apparatus 1 may be involved in the acquisition of the image data. In this case the image data may be acquired in an analogue form and converted using a suitable A/D converter to a digital form for further processing. The image data may also be received in a digital form, e.g. through direct acquisition in a digital form or via a computer network after having been acquired by a remote computer/medical instrument. Also, the image data may be pre-processed, for example it may by subjected to a Fourier transformation to yield suitable complex image data.

The storage unit 8 is preferably arranged to store suitable image data which are accessed by the computer program during the computations. The storage unit 8 preferably stores system parameters of the magnetic resonance apparatus, like the strength of the main field B0, gyromagnetic ratio 7, and suitable parameters of the target medium, like screen constant $\alpha$ in a file 3. The file 3 is used by the computing unit 4 for calculating absolute temperature difference maps from the phase maps. The apparatus 1 further comprises a working memory 6, typically based on RAM. The storage unit 8 can be used for storing the image data (or parts of it) when not being processed, and for storing operations on the image data and/or results of intermediate computations, like suitable phase images and suitable phase maps. The working memory 6 typically holds the (parts of) image data being processed and the instructions for the suitable image processing means used for processing those parts of the image data. The output 9 of the apparatus according to the invention comprises the computed temperature difference map, which can be used to control a suitable medical diagnostic or therapeutic device (not shown), or it may be visualized to a user or be stored for archiving purposes.

In case when the apparatus 1 is used for purposes of a real-time control of a medical procedure, like a SAR-management, RF-ablation control, RF-hyperthermia, etc., it is preferable that the computed temperature difference map is fed back to the user. For this purpose the apparatus according to the invention comprises a display 7 to visualize the computed temperature difference map. Preferably, the temperature difference map is visualized within a suitable interactive graphic user interface 7a.

FIG. 2 presents a schematic view of an embodiment of the magnetic resonance imaging system according to the invention. The magnetic resonance imaging system 10 according to the invention comprises the apparatus 1 arranged for computing the temperature difference map. Preferably, the operation of the apparatus 1, as is described with reference to FIG. 1, is controlled by means of a suitable computer program 11. The output of the apparatus 1 preferably comprises a suitable control signal S applicable to a suitable device, for example a magnetic resonance apparatus or another medical apparatus arranged to carry out the procedure of a temporal local temperature variation within a patient. The imaging system 10 according to the invention further comprises a magnetic resonance apparatus 21. An operation of a suitable magnetic resonance apparatus is described with reference to FIG. 3.

The output 15 of the apparatus 1, for example a graphic representation of the computed temperature difference map, is preferably made available to a display 32 for visualization purposes. Preferably, the visualization is enabled within a suitable graphic user interface 34, showing, for example a medical image 33 superposed with a temperature difference map 33a. It is possible that the temperature difference map occupies the whole cross-section of the image 33, or takes only a part of its area in accordance with a medical procedure. Preferably, the operation of the graphic user interface is controlled by a suitable computer program 36, stored in a further processor 35. The image 33 may be visualized as a single two-dimensional image, or a series of two-dimensional images, or, alternatively, a three-dimensional image. Preferably, for user's convenience, the display 32 comprises a high-resolution display, the user interface being operable by means of a suitable input device 37, for example a mouse, a keyboard or any other suitable user's input device.

FIG. 3 presents in a schematic way an embodiment of a magnetic resonance apparatus suitable for use in the magnetic resonance imaging system according to the invention. The magnetic resonance apparatus comprises a first magnet system 22, a second magnet system 23, a power supply unit 24, an RF transmitter and modulator 26, an RF transmitter coil 25, a transmitter-receiver circuit 29, a signal amplifier and demodulation unit 40, a processing unit 42, an image processing unit 43, a monitor 44, and a control unit 41. The first magnet system 22 serves to generate a steady magnetic field B0 in an imaging volume (not shown) of the magnetic resonance apparatus 21. The various gradient coils of the second magnet system 23 serve to generate additional magnetic fields having a gradient in the X, Y, Z directions, respectively. The Z direction of the coordinate system shown in FIG. 3 corresponds by convention to the direction of the steady magnetic field in the magnet system 22. The measuring coordinate system x,y,z to be used may be chosen independently of the X, Y, Z system illustrated in FIG. 3. In the context of the present application gradients are to be understood to mean temporary magnetic fields which are superposed on a steady magnetic field and cause a gradient in the steady magnetic field B0 in three respective orthogonal directions.

The gradient coils 23 are fed by the power supply unit 24. The RF transmitter coil 25 serves to generate RF magnetic fields and is connected to the RF transmitter and modulator 26. The transmitter coil 25 is connected to the signal amplifier and demodulator unit 40 via the transmitter-receiver circuit 29. The control unit 41 controls the RF transmitter and modulator 26, the power supply unit 24.

FIG. 4 presents a schematic view of the suitable data acquisition sequence. Preferably, a method of motion-compensated spectral-spatial selective magnetic resonance imaging is used. The method is known per se from, for example U.S. Pat. No. 5,891,032. According to this method a radio frequency spectral-spatial excitation sequence is applied to an object, notably a patient, whereby the sequence 70 comprises two sub-sequences 70a and 70b with their respective excitation pulses 72a, 72b comprising two sets of respective flip angles 72a', 72a", 72b', 72b" arranged to interleave the k-space with image data originating from the first medium and the second medium, notably water and fat. Thus, the sequence 70 comprises binomial slice-selective pulse trains 72a', 72a", 72b', 72b" which provide spectrally selective excitation of a selected resonant frequency at a predetermined field strength. The method further includes applying to the same region of the patient an oscillating slice selection gradient 74a, 74b so that each sub-pulse of the binomial pulse train 72a, 72b is applied during portions of the oscillating gradient having the same polarity. The oscillating gradient further includes at least one extra gradient pulse 74a''', 74b''' added to the end of the oscillating gradient 74a', 74b' for providing inherently motion compensated slice selection. The method further comprises phase encoding gradients 76a', 76b' and rewinding gradients 76a", 76b". Finally, readout gradients 80a, 80b are applied. The data acquisition of the type 70 is carried out for the first time moment and for the second time moment. The resulting image data is conceived to be used by the apparatus according to the invention to obtain temperature difference maps.

FIG. 5 presents a schematic view of a block-scheme of a work-flow 50 of the method according to the invention. At steps 51, 52, respectively, image data representative of the target medium response to a suitable magnetic excitation at the first time moment 51a and the second time moment 52a is acquired. Accordingly, a response of the reference medium to the magnetic excitation at the first time moment 51b and the second time moment 52b is acquired. It is noted that said acquisition may comprise either a real time data acquisition step using a suitable magnetic resonance apparatus, or a step of loading saved data from a suitable storage means. Also, although in this example separate two-dimensional images for the target medium and the reference medium are shown, they may be obtained using suitable MR-acquisition whereby signals from the target medium and the reference medium are detected separately. Alternatively, the signals from the target medium and the reference medium may be detected simultaneously, provided a corresponding acquisition sequence is designed so that these signals are in phase. In this case the images 51a, 51b, 52a, 52b are obtained using per se known image segmentation methods.

At respective steps 53, 55 corresponding phase images of the target medium 57 and the reference medium 59 for the first time moment are computed. At respective steps 54, 56 corresponding phase images of the target medium 58 and the reference medium 60 for the second time moment are computed. These images are used to compute a first phase map 63 and a second phase map 64, whereby for a given image the phase image for the first time moment is subtracted 61, 62 from the phase image for the second time moment. Preferably, the phase map for the reference image is subjected to a weighted polynomial fit to fit a two-dimensional surface. At step 67 the absolute temperature difference map is computed by subtracting 65 the second phase map from the first phase map and by normalizing the result with the parameters of the data acquisition, like the strength of the magnetic field B0, the gyromagnetic ratio $\gamma$, the value of the screen constant for the target medium $\alpha$. The resulting absolute temperature map 69 is preferably visualized using a suitable user interface for user's convenience.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. An apparatus for generating a time dependent phase error corrected temperature difference map comprising:
   a storage unit configured to store magnetic resonance image data indicative of magnetic resonance signals emitted from an animate object subjected to a magnetic resonance imaging procedure to measure a temporal local temperature variation within the animate object between a first time moment and a second time moment, which magnetic resonance imaging procedure is subject to time dependent phase errors, said animate object comprising a target water-based tissue medium and a reference fat tissue medium;
   a computing unit configured to:
   i. access a first phase image generated from the image data and representative of the target water-based tissue medium for the first time moment;
   ii. access a second phase image generated from the image data and representative of the reference fat tissue medium for the first time moment;
   iii. access a third phase image generated from the image data and representative of the target water-based tissue medium for the second time moment;
   iv. access a fourth phase image generated from the image data and representative of the reference fat tissue medium for the second time moment;

v. compute a first phase map by subtracting the first phase image from the third phase image for the target water-based tissue medium;
vi. compute a second phase map indicative of the time dependent phase error by subtracting the second phase image from the fourth phase image for the reference fat tissue medium;
vii. correct the first phase map for the time dependent phase errors by subtracting the second phase map from the first phase map,
viii. generate a time dependent phase error corrected temperature difference map based on the corrected first phase map.

2. The apparatus according to claim 1, wherein the apparatus further comprises:
an input arranged to forward the image data to the computing unit, the computing unit being further arranged to compute the first phase image, the second phase image, the third phase image, the fourth phase image.

3. The apparatus according to claim 1, wherein the computing unit is further arranged to calculate respective binary masks for the first phase image and for the second phase image.

4. The apparatus according to claim 1, wherein the computing unit is further arranged to fit the second phase image with a smoothing function.

5. The apparatus according to claim 1, further comprising a display for visualization of the temperature difference map.

6. The apparatus according to claim 1, wherein the reference fat tissue medium includes a medium which in the magnetic resonance procedure generates image data with a phase which changes with main magnetic field drift and changes in bulk susceptibility and which remains constant during temperature changes.

7. A magnetic resonance imaging system for computing a time dependent phase error corrected temperature difference map, the system comprising:
a magnetic resonance apparatus configured to acquire image data indicative of magnetic resonance signals emitted from an animate object subjected to a magnetic resonance imaging procedure which measures a temporal local temperature variation within the animate object between a first time and a second time, which magnetic resonance signals may be subject to a time dependent phase change between the first time and the second time, the animate object including a target medium in which the magnetic resonance signals are subject to a temperature dependent phase shift and a reference medium in which the magnetic resonance signals do not exhibit the temperature dependent phase shift; and
a computing unit configured to:
i. compute a first phase difference map from the image data representative of phase differences in the target medium between the first time and the second time, the target medium phase differences being indicative of both the time and temperature dependent phase shifts;
ii. compute a second phase difference map from the image data representative of phase differences in the reference medium between the first time and the second time, the reference medium phase differences being indicative of only the time dependent phase shift the second time;
iii. compute a time dependent phase error corrected temperature difference map indicative of temporal local temperature variation within the target medium between the first time and the second time from the first phase map corrected in accordance with the second phase map.

8. The imaging system according to claim 7, wherein the magnetic resonance apparatus is further arranged to acquire the image data using simultaneous imaging of the target medium and the reference medium.

9. The imaging system according to claim 7, wherein the magnetic resonance apparatus is further arranged to acquire the image data using an interleaved acquisitions of respective magnetic resonance images of the target medium and the reference medium.

10. The imaging system according to claim 7, wherein the reference medium is fat tissue which does not exhibit a temperature dependent frequency shift.

11. A method for computing a temperature difference map using image data indicative of magnetic resonance signals emitted from an object subjected to a magnetic resonance imaging procedure which determines a temporal local temperature variation within the animate object between a first time moment and a second time moment, the animate object comprising a target medium and a reference medium, the magnetic resonance imaging procedure inducing resonance signals in the target medium which undergoes time and temperature dependent phase changes and inducing in the reference medium resonance signals that are time dependent and temperature independent, the method comprising with one or more processors:
computing a first phase map indicative of the time and temperature dependent phase changes by subtractively combining a first phase image computed from the image data and representative of the target medium for the first time moment and a third phase image computed from the image data and representative of the target medium for the second time moment;
computing a second phase map indicative of the time dependent and temperature independent phase changes by subtractively combining a second phase image computed from the image data and representative of the reference medium for the first time moment and a fourth phase image computed from the image data and representative of the reference medium for the second time moment;
computing the temperature difference map from the first phase map corrected with the second phase map.

12. The method according to claim 11, wherein the reference medium is fat tissue.

13. The method according to claim 11, further including:
imaging of the target medium and the reference medium simultaneously.

14. The method according to claim 11, further including:
imaging the target medium and the reference medium using an interleaved acquisition technique.

15. The method according to claim 11, further including:
calculating binary masks for the first phase image and for the second phase image.

16. The method according to claim 11, wherein the reference medium does not exhibit a temperature dependent frequency shift.

17. The method according to claim 16, wherein the reference medium exhibits frequency shifts dependent on main field (B0) drift and changes in bulk susceptibility such that subtracting the first phase map with the second phase map corrects for the main field (B0) drift and the changes in bulk susceptibility.

18. The method according to claim 11, further including:
displaying the temperature difference map on a display device.

19. A non-transitory computer readable medium carrying program instructions to cause a processor to compute a time dependent phase error corrected temperature difference map using image data obtained during a magnetic resonance imaging procedure on an animate object by controlling the processor to carry out the steps of:

accessing a first phase image generated from the image data and representative of a target medium at a first time;

accessing a second phase image generated from the image data and representative of a reference medium at the first time, the reference medium being a medium in which a phase of magnetic resonance signals is temperature independent;

accessing a third phase image generated from the image data and representative of the target medium at a second time;

accessing a fourth phase image generated from the image data and representative of the reference medium at the second time;

computing a first phase map indicative of time and temperature dependent phase change of the target medium by subtracting the first phase image from the third phase image;

computing a second phase map indicative of time dependent phase change of the reference medium by subtracting the second phase image from the fourth phase image;

correcting the first phase map with the second phase map to generate the time dependent phase error corrected temperature difference map.

20. The non-transitory computer-readable medium according to claim 19, wherein the reference medium is fat tissue.

* * * * *